United States Patent
Ke

(10) Patent No.: US 11,483,504 B2
(45) Date of Patent: Oct. 25, 2022

(54) METHOD AND SYSTEM FOR IMAGE FORMAT CONVERSION APPLIED TO RGB-IR IMAGE SENSOR

(71) Applicant: TRIPLE WIN TECHNOLOGY(SHENZHEN) CO.LTD., Shenzhen (CN)

(72) Inventor: Nai-Cyun Ke, New Taipei (TW)

(73) Assignee: TRIPLE WIN TECHNOLOGY(SHENZHEN) CO.LTD., Shenzhen (CN)

(*) Notice: Subject to any disclaimer, the term of this patent is extended or adjusted under 35 U.S.C. 154(b) by 165 days.

(21) Appl. No.: 17/002,075

(22) Filed: Aug. 25, 2020

(65) Prior Publication Data

US 2021/0218917 A1   Jul. 15, 2021

(30) Foreign Application Priority Data

Jan. 11, 2020 (CN) .......................... 202010028528.5

(51) Int. Cl.
*H04N 5/369* (2011.01)
*H01L 27/146* (2006.01)

(52) U.S. Cl.
CPC ... *H04N 5/36965* (2018.08); *H01L 27/14621* (2013.01); *H01L 27/14647* (2013.01); *H01L 27/14649* (2013.01)

(58) Field of Classification Search
CPC ........... H04N 5/36965; H04N 9/04553; H04N 9/04515; H04N 9/04511; H01L 27/14621; H01L 27/14647; H01L 27/14649
See application file for complete search history.

(56) References Cited

U.S. PATENT DOCUMENTS

| | | | |
|---|---|---|---|
| 2004/0169749 A1* | 9/2004 | Acharya | H04N 9/04559 348/222.1 |
| 2004/0174446 A1 | 9/2004 | Acharya | |
| 2010/0303349 A1* | 12/2010 | Bechtel | H04N 9/04515 382/165 |
| 2012/0287286 A1* | 11/2012 | Nomura | G06T 3/4038 348/E5.085 |

FOREIGN PATENT DOCUMENTS

| | | |
|---|---|---|
| CN | 103686111 A | 3/2014 |
| CN | 109276231 A | 1/2019 |

* cited by examiner

*Primary Examiner* — Abdelaaziz Tissire
(74) *Attorney, Agent, or Firm* — ScienBiziP, P.C.

(57) ABSTRACT

A method for converting an image format applied to an RGB-IR image sensor includes: (Step 1) acquiring an RGB-IR image in digital form; (Step 2) selecting a pixel of the RGB-IR image as a center pixel and selecting a pixel unit with the center pixel at the center; (Step 3) interpolating the center pixel to obtain missing color components of the center pixel; (Step 4) repeating blocks (S2) and (S3) for interpolating each pixel of the RGB-IR image to obtain the missing color component of each pixel; and (Step 5) outputting an image after the interpolation process.

18 Claims, 8 Drawing Sheets

| B | G | R | G |
|---|---|---|---|
| G | IR | G | IR |
| R | G | B | G |
| G | IR | G | IR |

FIG. 2A

| R | G | B | G |
|---|---|---|---|
| G | IR | G | IR |
| B | G | R | G |
| G | IR | G | IR |

FIG. 2B

| B | G | R | G | B | G | R | G | B | G | R | G | u |
|---|---|---|---|---|---|---|---|---|---|---|---|---|
| G | IR | G | IR1 | G2 | IR3 | G4 | IR5 | G | IR | G | IR | |
| R | G | B | G6 | R7 | G8 | B9 | G10 | R | G | B | G | |
| G | IR | G | IR11 | G12 | IR13 | G14 | IR15 | G | IR | G | IR | |
| B | G | R | G16 | B17 | G18 | R19 | G20 | | | | | |
| G | IR | G | IR21 | G22 | IR23 | G24 | IR25 | | | | | |
| R | G | B | G | R | G | B | G | | | | | |
| G | IR | G | IR | G | IR | G | IR | | | | | |
| B | G | R | G | | | | | | | | | |
| G | IR | G | IR | | | | | | | | | |
| R | G | B | G | | | | | | | | | |
| G | IR | G | IR | | | | | | | | | | v

FIG. 5

METHOD AND SYSTEM FOR IMAGE FORMAT CONVERSION APPLIED TO RGB-IR IMAGE SENSOR

FIELD

The subject matter relates to image formats.

BACKGROUND

Figures 1A, 1B, 1C, 1D:
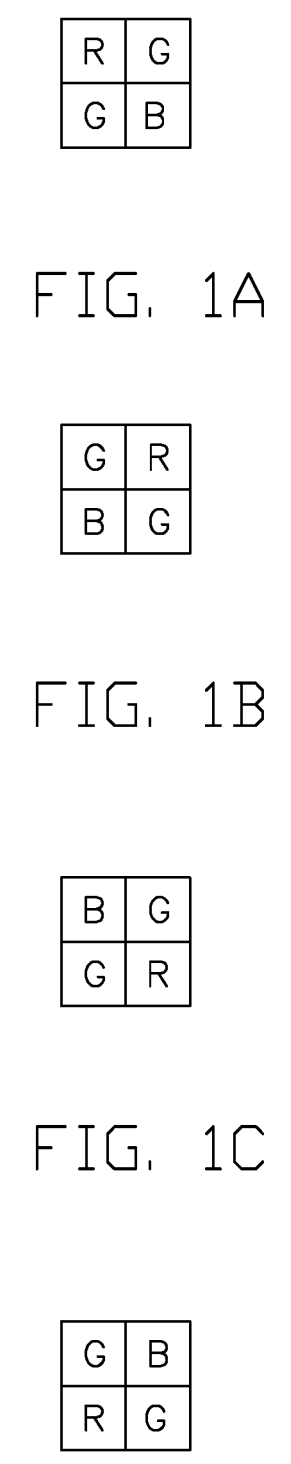

FIG. 1A to FIG. 1D show four traditional filter arrangements of Bayer color filter arrays (Bayer CFA). An RGB-IR sensor is a new type of image sensor equipped with RGB-IR filters. FIG. 2A and FIG. 2B show two common filter arrangements of RGB-IR. The RGB-IR filters replace part of the filters in the traditional Bayer CFA with infrared (IR) filters. The extra IR filters are helpful for the RGB-IR sensor to add body to nighttime images, and even realize a night vision technology.

However, each filter only allows one basic color to pass through. Therefore, when a normal RGB color image needs to be obtained from an RGB-IR image sensor, each pixel of the RGB-IR image with a single-color component needs to be converted into a pixel having an RGB color component.

Therefore, there is room for improvement within the art.

BRIEF DESCRIPTION OF THE DRAWINGS

Many aspects of the disclosure can be better understood with reference to the figures. The components in the figures are not necessarily drawn to scale, the emphasis instead being placed upon clearly illustrating the principles of the disclosure.

FIG. 1A to FIG. 1D are schematic diagrams of a Bayer filter array of the prior art.

FIG. 2A to FIG. 2B are schematic diagrams of an RGB-IR filter array according to an embodiment of the present disclosure.

FIG. 5 is a schematic diagram for obtaining a missing color component of a center pixel of an IR pixel unit, according to an embodiment of the present disclosure.

DETAILED DESCRIPTION

Figure 3:
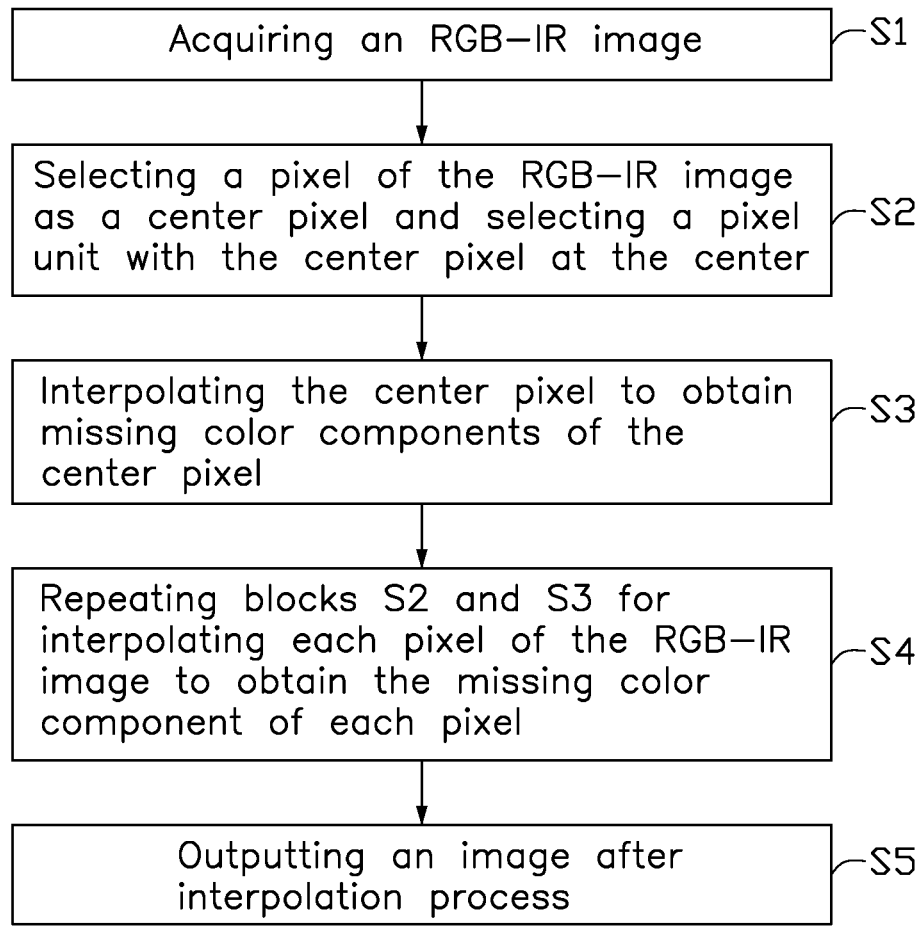
FIG. 3 is a flowchart of a method for image format conversion applied to an RGB-IR image sensor, according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Each pixel of a color image can be recorded and expressed with R, G, and B color components. However, an image sensor can only sense different intensities of light and cannot distinguish between different colors in the light. Therefore, a color filter army needs to be added in front of an RGB-IR image sensor, so that each pixel receives one basic color component. When an RGB-IR image output by the image sensor needs to be converted into an RGB image, the missing RGB color components of each pixel need to be obtained by interpolation. In the present disclosure, for convenience of description, pixels of the RGB-IR image sensor covered by red-color filters are called R pixels. Similarly, pixels of the RGB-IR image sensor covered by the green-color and blue-color filters, and the infrared (IR) filters, are called G pixels, B pixels, and IR pixels, respectively.

FIG. 3 illustrates a flowchart of a method for converting an image format in relation to an RGB-IR image sensor. The method is provided by way of example, as there are a variety of ways to carry out the method. Each block shown in FIG. 3 represents one or more processes, methods, or subroutines which are carried out in the example method. Furthermore, the order of blocks is illustrative only and additional blocks can be added or fewer blocks may be utilized without departing from the scope of this disclosure.

At block S1, an RGB-IR image is acquired in digital form.

In this embodiment, the RGB-IR image includes several pixels. Each pixel includes a basic color component. Each basic color component has an intensity value. The basic color component may be any one of R component, G component, B component, and IR component. For example, the basic color component of the R pixel is the R component. The R pixel has an intensity value of about "R". The intensity value of "R" is the color intensity of the R pixel. In another example, the basic color component of the IR pixel is the IR component. The IR pixel does not include other color components, such as the R component, G component, and B component.

In one embodiment, the R pixels, G pixels, B pixels, and IR pixels of the RGB-IR image may be arranged in any one of the two filter arrangements shown in FIG. 2A or FIG. 2B. In this embodiment, the R pixels, G pixels, B pixels, and IR pixels of the RGB-IR image are arranged according to the filter arrangement in FIG. 2A.

At block S2, a pixel of the RGB-IR image is selected as a center pixel and a pixel unit is selected with the center pixel at the center.

In this embodiment, each RGB-IR image has a different size. Usually, the size of the RGB-IR image is expressed as M*N, wherein M represents a width of the RGB-IR image, that is, the number of pixels in each row of the RGB-IR image. N represents a height of the RGB-IR image, that is, the number of pixels in each column of the RGB-IR image. As such, the RGB-IR image may form an image coordinate system according to its pixels, and each pixel has an imam coordinate.

Figure 4:
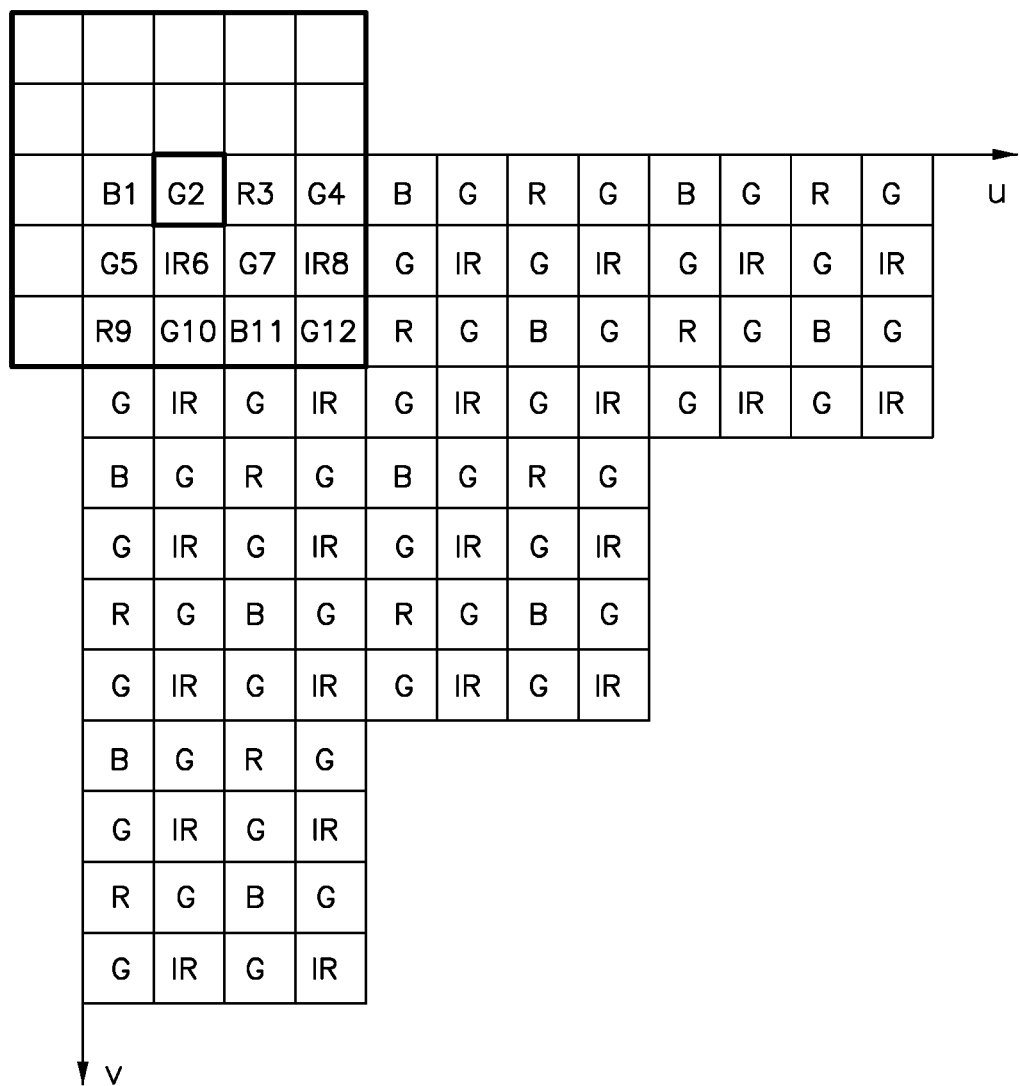
FIG. 4 is a schematic diagram for obtaining a missing color component of a center pixel of an edge pixel unit, according to an embodiment of the present disclosure.

For example, referring to FIG. 4, for the RGB-IR image, the pixel on the upper left corner of the RGB-IR image can be used as an origin to establish a u-axis and a v-axis, respectively. The u-axis indicates the number of columns where the pixel is located. The v-axis indicates the number of rows where the pixel is located. In this way, each pixel can represent the location in the RGB-IR image by coordinates (u, v).

For example, a pixel coordinate of the upper left corner of the RGB-IR image is (1, 1). A pixel coordinate of the pixel next to the upper left corner is (1, 2). In this way, the coordinates of each pixel in the whole RGB-IR image can be obtained. In this embodiment, a value range of u is from 1 to M. A value range of v is from 1 to N.

In this embodiment, a content of the pixel unit can be selected according to requirements, for example, a pixel unit including 3*3 pixels, a pixel unit including 5*5 pixels, or a pixel unit including 7*7 pixels can be selected. In this embodiment, the pixel unit includes 5*5 pixels.

In block S2, when a center pixel is selected, the coordinate of the center pixel can be obtained at the same time. Since the pixel unit is centered on the center pixel, the coordinates of each pixel of the pixel unit can be inferred from the coordinate of the center pixel.

At block S3, the center pixel is interpolated to obtain the missing color components of the center pixel.

In this embodiment, each pixel of the RGB-IR image has a basic color component. For the center pixel, it is only necessary to supplement the missing color components of the RGB components of the center pixel. For example, when the center pixel is an R pixel, the basic color component of the center pixel is an R component. Then, it is only necessary to supplement the G component and the B component of the center pixel. In another embodiment, when the center pixel is an IR pixel, the basic color component of the center pixel is an IR component. Then, it is necessary to supplement the R component, G component, and B component of the center pixel.

That is, in this embodiment, each pixel of the RGB-IR image has two missing color components or three missing color components. For example, each of the R pixel, the G pixel, and the B pixel has two missing color components. The IR pixel has three missing color components.

In this embodiment, the interpolation process is to select three or two average values of an average of the R intensity values of all R components of the pixel unit, an average of the G intensity values of all G components, and an average of the B intensity values of all B components. Then, the three or two average values are assigned to the center pixel, so that the missing color component of the center pixel has an intensity value, thereby the missing color component of the center pixel is obtained.

In this embodiment, before the center pixel is interpolated, the method further includes determining the basic color component of each pixel of the pixel unit and determining the missing color component of the center pixel. After the determination is completed, a calculation is made of the average value of the intensity values of the color components having the same color as the missing color component of the center pixel, and assigning the average value of the intensity values to the center pixel. Then the missing color component of the center pixel is obtained and the interpolation process is completed.

In this embodiment, since each pixel of the RGB-IR image is arranged in order, the basic color component of each pixel can be determined through the image coordinate of each pixel of the pixel unit. The determination method is, for example, dividing a u-coordinate vector and a v-coordinate vector of the pixels of the RGB-IR image by 4, respectively, to obtain a remainder of 0, 1, 2, or 3. When the remainder after the u-coordinate is 1, the z-coordinate of the pixel matrix in FIG. 2A having the same color component as the pixel is 1. When the remainder after the u-coordinate the u-coordinate of the pixel matrix in FIG. 2A having the same color component as the pixel is 2. When the remainder after the u-coordinate is 3, the u-coordinate of the pixel matrix in FIG. 2A having the same color component as the pixel is 3. When the remainder after the u-coordinate is 0, the u-coordinate of the pixel matrix in FIG. 2A having the same color component as the pixel is 4.

Similarly, when the remainder after the v-coordinate is 1, the v-coordinate of the pixel matrix in FIG. 2A having the same color component as the pixel is 1. When the remainder after the v-coordinate is 2, the v-coordinate of the pixel matrix in FIG. 2A having the same color component as the pixel is 2. When the remainder after the v-coordinate is 3, the v-coordinate of the pixel matrix in FIG. 2A having the same color component as the pixel is 3. When the remainder after the v-coordinate is 0, the v-coordinate of the pixel matrix in FIG. 2A having the same color component as the pixel is 4.

For example, for a pixel of the RGB-IR image with a coordinate (16, 1), the conversion process must divide the u-coordinate and v-coordinate of the pixel by 4, respectively. Since the remainder of 16 divided by 4 is 0 and the remainder of 1 divided by 4 is 1, the pixel with the coordinate (16, 1) has the same base color component as the pixel with image coordinates (4, 1) in FIG. 2A.

In this embodiment, when the center pixel is located at an edge of the image, that is, when the center pixel is an edge pixel, the selected pixel unit will include blank pixels. In this embodiment, the blank pixels are not referred to, that is, the pixel unit does not count the number of blank pixels when calculating the average value of the intensity values of the RGB color channels.

In this embodiment, the pixel unit is divided into an edge pixel unit, an IR pixel unit, and a complete pixel unit. When the selected center pixel is an edge pixel, the pixel unit selected with the center pixel is an edge pixel unit, and the edge pixel unit includes blank pixels or pixels which are partly blank.

In this embodiment, the determination of the edge pixels is related to the size of the pixel unit. When the pixel unit is an n*n pixel unit, and an integer quotient of n/2 is c, then all pixels in the first c row, first c column, last c row, and last c column of the RGB-IR image are edge pixels. For example, as illustrated in FIG. 4, in this embodiment, the pixel unit is a 5*5 pixel unit. Since the integer quotient of 5/2 is 2, then, all pixels in the first two columns, the first two rows, the last two columns, and the last two rows of the RGB-IR image are edge pixels.

When the selected center pixel is an IR pixel, the pixel unit selected with the center pixel is an IR pixel unit. When the selected center pixel is neither an edge pixel nor an IR pixel, the pixel unit selected with the center pixel is a complete pixel unit.

In this embodiment, when a center pixel is selected, the coordinate of the center pixel is obtained at the same time. With the coordinate of the center pixel, the basic color component, and the missing color component of the center pixel, the coordinates of each pixel of the pixel unit including the center pixel can be determined. Since each pixel of the RGB-IR image is arranged in order, the basic color component of each pixel of the pixel unit can be determined from the coordinates of each pixel of the pixel unit.

In this embodiment, the missing color components of the pixels of the RGB-IR image are the missing components among the three color components of RGB. That is, the missing color components are any two or all of the R component, the G component, and the B component.

In this embodiment, each of the R pixel, the G pixel, and the B pixel of the RGB-IR image have two missing color components. The IR pixel has three missing color components. Further, each of the missing color components has a color intensity value. By assigning the color intensity value of the missing color component of the center pixel, the center pixel obtains the missing color component.

Specifically, a total number $S_a$ of color components of the pixel unit and a sum $S_b$ of the intensity values of the color components of the pixel unit are counted. Then an average value $S_0$ of the color intensity values of the color components can be formulated as shown in this equation:

$$i\ S_0 = [S_b/S_a] \quad \text{equation (1)}$$

In this embodiment, the average value $S_0$ of the color intensity values is rounded. That is, for an actual value obtained by $S_b/S_a$, the value after the decimal point is ignored, and only an integer is taken.

The average value $S_0$ is assigned to the missing color component of the RGB components of the center pixel, thus the center pixel obtains the missing color component.

At block S4, according to the blocks S2 and S3, that is, repeating blocks S2 and S3, then each pixel of the RGB-IR image is interpolated to obtain the missing color component of each pixel.

In this embodiment, the interpolation is started from the pixel at the upper left corner of the RGB-IR image. When the interpolation of the pixels in one row is completed, the interpolation is started from the leftmost pixel in the next row until the interpolation of all pixels of the entire RGB-IR image is completed.

At block S5, the image after the interpolation process is output.

In this embodiment, after the interpolation, each pixel of the image includes an R component, a G component, and a B component.

Figure 6:
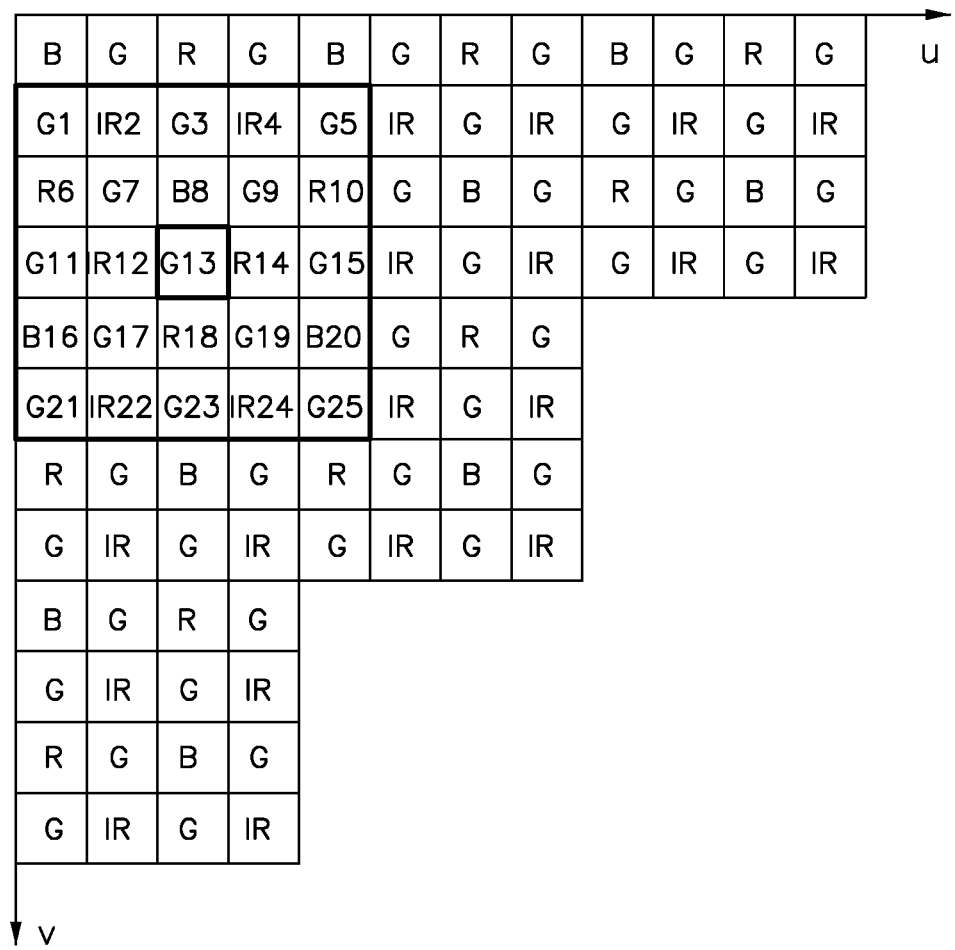
FIG. 6 is a schematic diagram for obtaining a missing color component of a center pixel of a complete pixel unit, according to an embodiment of the present disclosure.

As illustrated in FIG. 4 to FIG. 6, taking a pixel unit as an edge pixel unit, an IR pixel unit, and an IR pixel unit as an example, block S3 is described.

FIG. 4 shows a schematic diagram of obtaining the missing color component of the center pixel when the pixel unit is an edge pixel unit. In FIG. 4, "B1" indicates that the pixel is a B pixel and the intensity value of the B pixel is 1. Similarly, "IR6" indicates that the pixel is an IR pixel and the intensity value of the IR pixel is 6. In this embodiment, the intensity values of some pixels marked in FIGS. 4 to 6 are only for the convenience of description, the intensity values of other pixels are not marked in the figures.

In block S3, the basic color component of each pixel of the edge pixel unit has been determined. As illustrated in FIG. 4, the center pixel selected in FIG. 4 is a G pixel, and the missing color components of the center pixel G are R component and B component. Therefore, in this embodiment, the average intensity values of the R component and the B component of the edge pixel unit need to be counted.

In this embodiment, the edge pixel unit includes two R components, and the intensity values are 3 and 9. That is, the sum of the intensity values of the two R components is 12.

The edge pixel unit includes two B components, and the intensity values are 1 and 11. That is, the sum of the intensity values of the two B components is 12. Substituting the total number "2" of R components of the pixel unit and the sum "12" of the intensity values of the R component into the equation (1) to obtain the average value of the intensity values of the R component of the edge pixel unit according to following equation:

$$S_R = \left[\frac{S_b}{S_a}\right] = \left[\frac{12}{2}\right] = 6 \quad \text{equation (2)}$$

Similarly, the total number "2" of B components of the pixel unit and the sum "12" of the intensity values of the B components are substituted into the equation (1) to obtain the average value of the intensity values of the B component of the edge pixel unit according to the following equation:

$$S_B = \left[\frac{S_b}{S_a}\right] = \left[\frac{12}{2}\right] = 6 \quad \text{equation (3)}$$

The average value of the intensity values of the R components and the average value of the intensity values of the B components are respectively assigned to the missing R component and the B component of the center pixel, then the center pixel is converted from the original B pixel into an RGB pixel having the R component, G component, and B component, and an RGB vector of the center pixel is (6, 2, 6).

FIG. 5 is a schematic diagram illustrating the missing color component of the center pixel being obtained when the pixel unit is an IR pixel unit. The center pixel selected in FIG. 5 is an IR pixel, and the missing color components of the center pixel are the R component, the G component, and the B component. Therefore, in this embodiment, the average intensity values of the R component, G component, and B component of the IR pixel unit need to be counted.

In this embodiment, the IR pixel unit includes two R components, twelve G components, and two B components. That is, the sum of the intensity values of the two R components is 13 as follows:

$$S_R = \left[\frac{S_b}{S_a}\right] = \left[\frac{7+9}{2}\right] = 13 \quad \text{equation (4)}$$

The sum of the intensity values of the twelve G components is 13 as follows:

$$S_G = \frac{S_b}{S_a} = \left[\frac{\begin{array}{c}2+4+6+8+10+12+14+\\16+18+20+22+24\end{array}}{12}\right] = 13 \quad \text{equation (5)}$$

The sum of the intensity values of the two B components is 13, according to this equation:

$$S_B = \left[\frac{S_b}{S_a}\right] = \left[\frac{9+17}{2}\right] = 13 \quad \text{equation (6)}$$

The average intensity values of the R component, the G component, and the B component are assigned to the R component, the G component and the B component that are missing from the center pixel, respectively, then the center pixel is converted from an original IR pixel into an RGB pixel with an R component, a G component, and a B component, and an RGB vector of the center pixel is (13, 13, 13).

FIG. 6 is a schematic diagram illustrating the missing color component of the center pixel being obtained when the pixel unit is a complete pixel unit. The center pixel selected in FIG. 6 is a G pixel, and the missing color components of the center pixel are the R component and the B component, Therefore, in this embodiment, the average intensity values of the R component and B component of the complete pixel unit need to be counted.

in this embodiment, the complete pixel unit includes three R components and three B components. That is, the average intensity values of the R components is 11 as calculated by the equation:

$$S_R = \frac{S_b}{S_a} = \left[\frac{6+10+18}{3}\right] = 11 \quad \text{equation (7)}$$

The average intensity values of the B components is 14 as calculated by the equation:

$$S_R = \frac{S_b}{S_a} = \left[\frac{8+16+20}{3}\right] = 14 \quad \text{equation (8)}$$

The average intensity values of the R component and the B component are as to the R component and the B component that are missing from the center pixel, respectively, then the center pixel is converted from an original G pixel into an RGB pixel with an R component, a G component, and a B component, and an RGB vector of the center pixel is (11, 13, 14).

In this embodiment, each pixel of the RGB-IR image is interpolated to supplement the missing color vector of each pixel, so that each pixel of the image has an R component, a G component, and B component.

Figure 7:
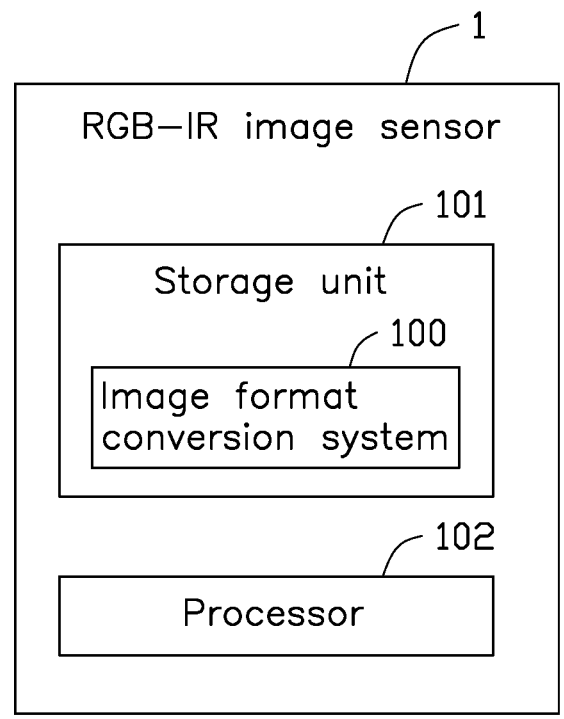
FIG. 7 is a block diagram of an RGB-IR image sensor, according to an embodiment of the present disclosure.
Figure 8:
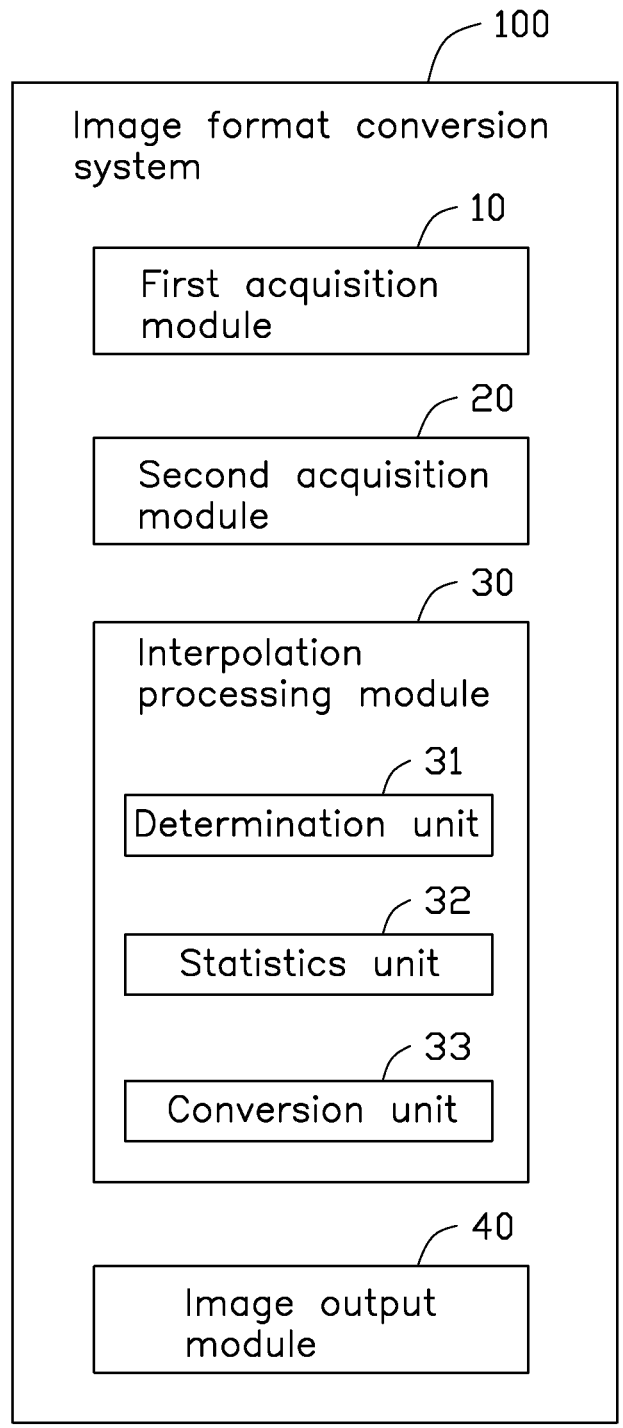
FIG. 8 is a block diagram of a system for an image format conversion applied to the RGB-IR image sensor of FIG. 7.

FIG. 7 illustrates a system 100 for an image format conversion applied to an RGB-IR image sensor 1. As illustrated in FIG. 8, the system 100 includes a first acquisition module 10, a second acquisition module 20, an interpolation processing module 30, and an image output module 40. In this embodiment, the function modules 10, 20, 30, and 40 of the system 100 can include computerized codes in the form of one or more programs, which are stored in a storage unit 101 of the RGB-IR image sensor 1. The RGB-IR image sensor 1 also includes at least one processor 102 to execute the computerized codes to provide functions of the function modules 10, 20, 30, and 40.

The first acquisition module 10 acquires data of an RGB-IR image from an RGB-IR image sensor. The pixels of the RGB-IR image are arranged in any one of the two filter arrangements shown in FIG. 2A or FIG. 2B.

The second acquiring unit 20 acquires a pixel of the RGB-IR image as a center pixel and selects one pixel unit with the center pixel as the center.

In this embodiment, when a center pixel is selected, the coordinate of the center pixel can be obtained at the same time. Since the pixel unit is centered on the center pixel, the coordinates of each pixel of the pixel unit can be inferred from the coordinate of the center pixel.

In this embodiment, a pixel unit can be selected according to requirements. For example, the pixel unit can be a square pixel unit which includes an odd number of pixels. In this embodiment, the pixel unit may include 3*3 pixels, 5*5 pixels, or 7*7 pixels.

The interpolation processing module 30 interpolates the center pixel to obtain the missing color component of the center pixel. In this embodiment, the interpolation processing module 30 includes a determination unit 31, a statistics unit 32, and a conversion unit 33.

The determination unit 31 calculates the coordinates of each pixel of the pixel unit, thereby determining the basic color component of each pixel of the pixel unit, and determining the missing color component of the center pixel.

The statistical unit 32 counts the total number of the missing color components and the sum of intensity values of the pixel unit, so as to calculate the average intensity values corresponding to the missing color components of the pixel unit.

The conversion unit 33 assigns the average intensity value to the center pixel, so as to obtain the missing color component of the center pixel.

The image output module 40 outputs the image after the interpolation process.

By taking each pixel as a center pixel, the system 100 obtains pixel units one by one and obtains an average intensity value of a color component that has a same color as the missing color component of the center pixel of the pixel unit. The average intensity value is assigned to the center pixel, thereby obtaining the missing color component of the center pixel. Finally, a conversion of a single-color component to multi-color components of each pixel of the RGB-IR image is completed, which converts the image format of the RGB-IR image.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A method for an image format conversion applied to an RGB-IR image sensor, the method comprising:
   (S1) acquiring an RGB-IR image;
   (S2) selecting a pixel of the RGB-IR image as a center pixel and selecting a pixel unit with the center pixel at the center;
   (S3) interpolating the center pixel to obtain missing color components of the center pixel by assigning a color intensity value to each of the missing color components of the center pixel;
   (S4) repeating blocks (S2) and (S3) for interpolating each pixel of the RGB-IR image to obtain the missing color component of each pixel; and
   (S5) outputting an image after the interpolation process.

2. The method of claim 1, wherein each pixel comprises a basic color component, the basic color component is any one of R component, G component, B component, and IR component.

3. The method of claim 1, wherein the missing color components are R component, G component, and B component; or the missing color components are any two color components of the R component, G component, and B component.

4. The method of claim 1, before the block (S2), the method further comprising:
determining the basic color component of each pixel of the pixel unit and determining the missing color component of the center pixel.

5. The method of claim 1, wherein the pixel unit comprises an edge pixel unit, an IR pixel unit, and a complete pixel unit.

6. The method of claim 5, wherein a center pixel of the edge pixel unit is any one of edge pixels of the RGB-IR image, the edge pixel unit comprises a part of blank pixels.

7. The method of claim 5, wherein a center pixel of the IR pixel unit is any one of IR pixels of the RGB-IR image, the missing color components of the IR pixel comprises R component, G component, and B component.

8. The method of claim 5, wherein a center pixel of the complete pixel unit is any pixel neither an edge pixel nor an IR pixel.

9. The method of claim 1, wherein in block (S4), the interpolation is started from the pixel at the upper left corner of the RGB-IR image, when the interpolation of the pixels in one row is completed, the interpolation is started from the left of the pixels in the next row until the interpolation of all pixels of the entire RGB-IR image is completed.

10. The system of claim 1, wherein the missing color components are R component, G component, and B component; or
the missing color components are any two color components of the R component, G component, and B component.

11. The system of claim 1, wherein in block (S4), the interpolation is started from the pixel at the upper left corner of the RGB-IR image, when the interpolation of the pixels in one row is completed, the interpolation is started from the left of the pixels in the next row until the interpolation of all pixels of the entire RGB-IR image is completed.

12. A system for an image format conversion applied to an RGB-IR image sensor, the RGB-IR image sensor comprising a storage unit and at least one processor, the system comprising a plurality of function units stored in the storage unit and causing the at least one processor to:
(S1) acquire an RGB-IR image;
(S2) select a pixel of the RGB-IR image as a center pixel and selecting a pixel unit with the center pixel at the center;
(S3) interpolating the center pixel to obtain missing color components of the center pixel;
(S4) repeat blocks (S2) and (S3) for interpolating each pixel of the RGB-IR image to obtain the missing color component of each pixel; and
(S5) output an image after the interpolation process;
wherein each of the missing color components has a color intensity value, by assigning the color intensity value of the missing color component of the center pixel, the center pixel obtains the missing color component.

13. The system of claim 12, wherein each pixel comprises a basic color component, the basic color component is any one of R component, G component, B component, and IR component.

14. The system of claim 12, before the block (S2), the image format conversion system further causes the at least one processor to:
determine the basic color component of each pixel of the pixel unit and determine the missing color component of the center pixel.

15. The system of claim 12, wherein the pixel unit comprises an edge pixel unit, an IR pixel unit, and a complete pixel unit.

16. The system of claim 15, wherein a center pixel of the edge pixel unit is any one of edge pixels of the RGB-IR image, the edge pixel unit comprises a part of blank pixels.

17. The system of claim 15, wherein a center pixel of the IR pixel unit is any one of IR pixels of the RGB-IR image, the missing color components of the IR pixel comprises R component, G component, and B component.

18. The system of claim 15, wherein a center pixel of the complete pixel unit is any pixel neither an edge pixel nor an IR pixel.

* * * * *